United States Patent [19]

Reinke, Jr.

[11] Patent Number: 4,924,404
[45] Date of Patent: May 8, 1990

[54] ENERGY MONITOR

[75] Inventor: Karl L. Reinke, Jr., Dundee, Ill.

[73] Assignee: K. Reinke, Jr. & Company, Dundee, Ill.

[21] Appl. No.: 179,882

[22] Filed: Apr. 11, 1988

[51] Int. Cl.$^5$ .............. G01D 4/00; G01R 11/56; G06F 15/22
[52] U.S. Cl. .............. 364/464.04; 364/550; 364/483
[58] Field of Search ............ 364/483, 550, 464.04

[56] References Cited

U.S. PATENT DOCUMENTS

| | | | |
|---|---|---|---|
| 4,120,031 | 10/1978 | Kincheloe et al. | 364/483 |
| 4,253,151 | 2/1981 | Bouve | 364/483 |
| 4,261,037 | 4/1981 | Hicks | 364/483 |
| 4,291,376 | 9/1981 | McCahill | 364/483 |
| 4,399,510 | 8/1983 | Hicks | 364/483 |
| 4,814,996 | 3/1989 | Wang | 364/464.04 |

FOREIGN PATENT DOCUMENTS

| | | | |
|---|---|---|---|
| 2093615 | 9/1982 | United Kingdom | 364/464.04 |
| 2095879 | 10/1982 | United Kingdom | 364/464.04 |

Primary Examiner—Felix D. Gruber
Attorney, Agent, or Firm—Wood, Phillips, Mason, Recktenwald & Vansanten

[57] ABSTRACT

An energy monitor for monitoring energy consumed by each of a plurality of energy consuming devices is disclosed. The energy monitor comprises a processor, a memory, means for storing energy usage rate data in the memory, the energy usage rate data representing a rate of energy consumed by each of the devices, means for determining when each of the devices is operating, means responsive to the storing means and the determining means for calculating energy consumption numbers representing a quantity of energy consumed by each device while each of the devices is operating and means for selectively displaying each of the energy consumption numbers.

12 Claims, 8 Drawing Sheets 4,924,404

ENERGY MONITOR

FIELD OF THE INVENTION

The present invention relates to an apparatus for monitoring energy consumed by one or more energy consuming devices.

BACKGROUND OF THE INVENTION

In today's world of rapidly escalating energy prices, energy costs associated with operating such basic home appliances as a furnace, an air conditioner and a hot water heater have become extremely significant expenses for a homeowner.

While the homeowner may attempt to budget for these energy expenses, the resulting energy bills do not arrive until after the energy has been consumed. At this time it is too late to attempt to adjust energy consumption so as to conserve energy.

Further it is difficult to judge the effectiveness of energy conservation attempts as one cannot obtain immediate feedback regarding the attempts.

The invention is provided to solve one or more of these problems.

SUMMARY OF THE INVENTION

It is an object of Applicant's invention to provide an energy monitor for monitoring energy consumed by an energy consuming device.

In accordance with the invention, the energy monitor comprises a processor, a memory, means for storing energy consumption data in the memory, the energy consumption data representing a rate of energy consumption by the device to be monitored, means for determining when the device is operating, means responsive to the data storing means and the determining means for calculating a number representing a quantity of energy consumed while the device is operating and means for displaying the calculated number. The calculated number represents the quantity of energy consumed by the device, as for example kilowatt-hours if the particular energy consumed is electricity, or cubic feet or therms if the particular energy consumed is gas.

The invention further comprehends means for storing budget data in the memory, the budget data representing a budgeted quantity of energy permitted to be consumed by the device, means for subtracting the calculated number from the budgeted quantity to determine a remaining number representing a remaining quantity of energy permitted by the budget to be consumed and means for displaying the remaining number.

It is further comprehended that the energy monitor individually monitor energy consumed by each of a plurality of energy consuming devices.

BRIEF DESCRIPTION OF THE DRAWINGS

Other features and advantages of the invention will be apparent from the following description taken in connection with the drawings, wherein.

DESCRIPTION OF THE PREFERRED EMBODIMENT

Figure 1:
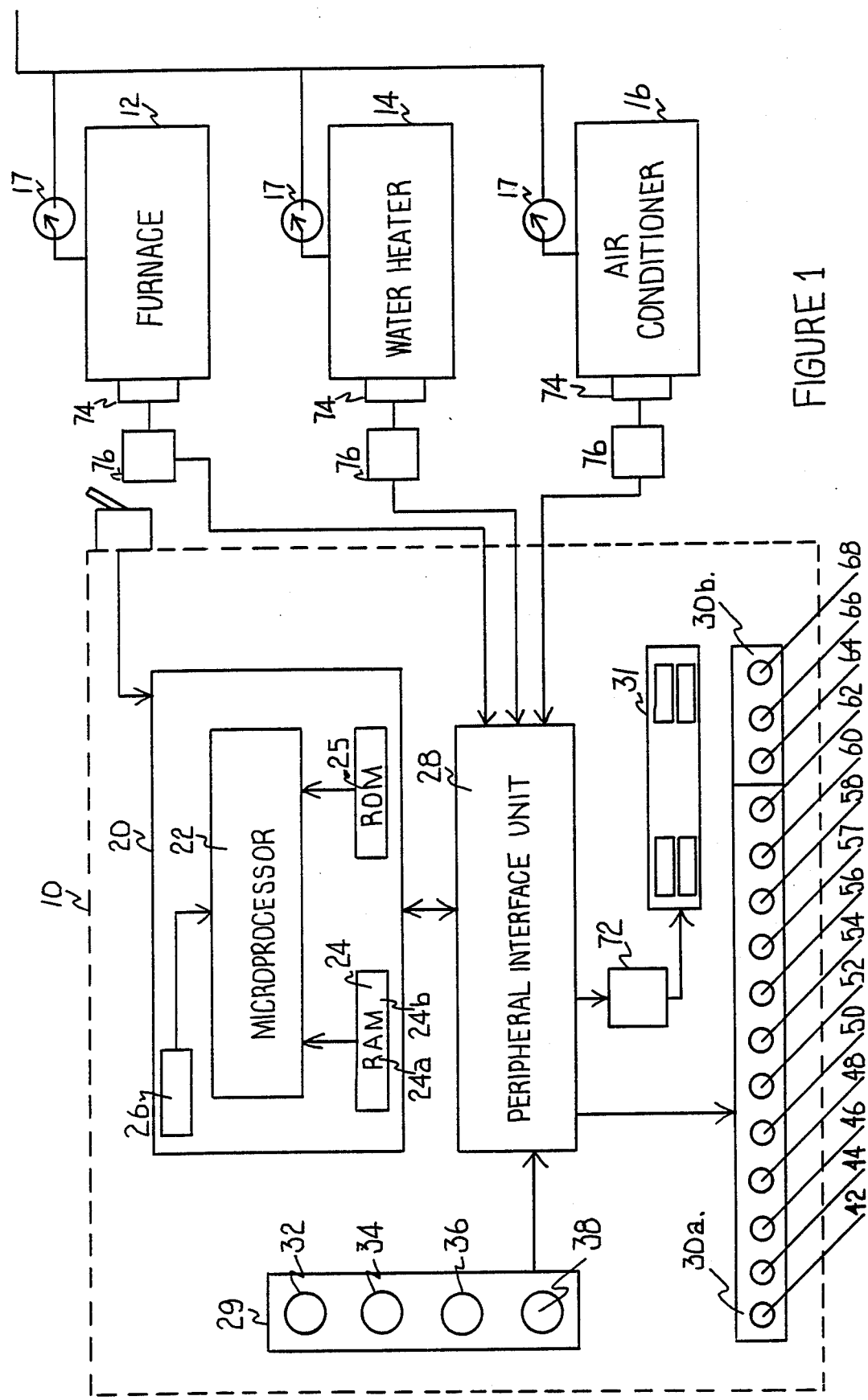
FIG. 1 is a block diagram of the invention coupled to three energy consuming devices.

An energy monitor 10 coupled to energy consuming devices, generally designated 11, for example a furnace 12, a water heater 14 and an air conditioner 16, is illustrated in FIG. 1. Each of the energy consuming devices 11 includes a respective meter 17 which indicates respective amounts of energy consumed.

As discussed in greater detail below, the energy monitor 10 is a processor based unit to monitor gas and/or electric energy consumption in a real time basis. The energy monitor 10 continuously calculates running time data representing a total time that each of the furnace 12, the water heater 14 and the air conditioner 16 are operating. The energy monitor 10 stores user programmed energy usage rate data and budget data. The energy usage rate data represents a rate of energy consumption for each of the energy consuming devices 11. The budget data represents a predetermined quantity of energy that the user of each of the energy consuming devices 11 has budgeted as permitted to be consumed during a given time period, as for example, a month. Both the energy usage rate data and the budget data are selectively programmed into the energy monitor 10 by the user, as discussed in greater detail below.

Utilizing the energy usage rate data and the running time data, the energy monitor 10 calculates a total quantity of gas (in therms) consumed by the furnace 12, a total quantity of gas (in therms) consumed by the water heater 14 as well as a total quantity of electricity (in kilowatt-hours) consumed by the air conditioner 16. In addition, the energy monitor 10 subtracts the total quantity of gas consumed by both the furnace 12 and the water heater 14 from the budget data to calculate a remaining quantity of gas (in therms) which can be consumed without exceeding the predetermined budgeted quantity.

The energy monitor 10 can individually display a total time that each of the energy consuming devices 11 has operated (running time data), the total energy consumed by each of the energy consuming devices 11 (energy used data), the energy usage rate, as programmed, of each of the energy consuming devices 11 (energy usage rate data), the total quantity of gas consumed by both the furnace 12 and the water heater 14, the amount of gas budgeted to be consumed by both the furnace 12 and the water heater 14 (the budget data) as well as the budgeted amount of gas remaining.

The energy monitor 10 includes a microcomputer 20 including a microprocessor 22, a random access memory (RAM) 24 and a read only memory (ROM) 25. The microcomputer 20 further includes a timer 26 which generates an interrupt pulse every two milliseconds.

The ROM 25 stores an operating program for the microprocessor 22. A manually operable clear all memory switch 27 is coupled to the microcomputer 20 and determines which registers of the RAM 24 are cleared upon power-up of the energy monitor 10, as discussed later.

The energy monitor 10 further includes a peripheral interface unit 28 which couples the microcomputer 20 to various I/O devices, including operator switches, generally designated 29, a mode display 30 and an LED display 31.

The operator switches 29 comprise a mode advance pushbutton 32, an enable pushbutton 34, an up display pushbutton 36 and a down display push button 38 and allows the user both to selectively input the energy usage rate data and the budget data in the RAM 24 and to selectively control the LED display 31.

The mode display 30 includes first and second groups 30a, 30b of LED indicator lights.

The first mode display group 30a represents mode display options and includes:
a "furnace run time" indicator light 42;
a "furnace therms used" indicator light 44;
a "water heater run time" indicator light 46;
a "water heater therms used" indicator light 48;
an "air conditioner run time" indicator light 50;
an "air conditioner kilowatt-hours used" indicator light 52;
a "furnace usage rate" indicator light 54;
a "water heater usage rate" indicator light 56;
an "air conditioner usage rate" indicator light 57;
a "therms budgeted" indicator light 58;
a "total therms used" indicator light 60; and
a "budget therms remaining" indicator light 62.

The RAM 24 includes both nonvolatile, battery backed up memory 24a and volatile memory 24b. The nonvolatile RAM memory 24a includes a register relating to each of the mode display options, and these nonvolatile registers store data representing the current value of each of the mode display options, for example, a "furnace run time" register stores data representing the total time the furnace 12 has operated and a "furnace usage rate" register stores data representing the programmed rate of energy consumed by the furnace 12. The volatile memory 24b includes registers which operate as interval timers. As discussed below, these interval timers act as high resolution counters for each of the run time registers, the energy consumed registers and budget related registers.

One of the first mode display group 30a indicator lights is illuminated at any given time, and the illuminated one indicates what information is currently being displayed by the LED display 31. For example, if the "furnace run time" indicator light 42 is illuminated, the total run time of the furnace 12 is displayed by the LED display 31. As is discussed in greater detail below, in order for the LED display 31 to display the "furnace therms used", the mode advance pushbutton 32 is depressed once, advancing the illuminated one of the mode display group 30a indicator lights to the "furnace therms used" indicator light 42. Other ones of the mode display options are similarly selected.

The second mode display group 30b comprises a "furnace running" indicator light 64, a "water heater running" indicator light 66 and an "air conditioner running" indicator light 68. The "furnace running" indicator light 66 is illuminated when the furnace 12 is operating. Similarly, the "water heater running" indicator light 66 and the "air conditioner running" indicator light 68 are each illuminated when the water heater 14 and the air conditioner 16 are operating, respectively.

The LED display 31 is a typical six digit, seven segment per digit, LED device coupled to the peripheral interface unit 28 by a converter 72. The converter 72 time-division multiplexes data from the peripheral interface unit 28 to the LED display 31 to drive the six digits.

The furnace 12, the water heater 14 and the air conditioner 16 each includes a control 74, as for example, a thermostat, for turning on and off its respective device. Three interface units 76, one coupled to each of the controls 74, converts a control signal generated by its respective control 74 to a digital input for the peripheral interface unit 28 which provides an operating signal for the microprocessor 22 indicating when each of the energy consuming devices 11 are operating.

Prior to utilizing the energy monitor 10, the energy consumption data and the budget data must be programmed in the RAM 24.

Data representing the rate of gas consumed by the furnace 12, or furnace usage rate data, is entered by depressing the mode advance pushbutton 32, thereby cyclically illuminating each one of the lights of the first mode display group 30a until the "furnace usage rate" indicator light 54 is illuminated. At this time, the current value stored in the furnace usage rate register of the nonvolatile RAM 24a, if any, is displayed by the LED display 31. This value is changed by simultaneously depressing the enable display pushbutton 34 in conjunction with either the up-display pushbutton 36 or the down-display pushbutton 38, as required to set the LED display 31 to the proper value. As is well known in the art, the enable display pushbutton 34 is provided to minimize inadvertent alteration of stored data. The furnace usage rate data is entered in the dimension of the time in seconds for ten cubic feet of gas to be consumed by the furnace 12. This is determined by turning on the furnace 12, viewing the meter 17 attached to the furnace 12 and measuring the time for ten cubic feet of gas to be consumed. This measured time is entered as the furnace usage rate.

To enter the water heater usage rate data into the water heater usage rate register of the RAM 24, the mode advance pushbutton 32 is depressed until the "water heater usage rate" indicator light 56 is illuminated. One then again simultaneously depresses the enable display pushbutton 34 and either the up-display pushbutton 36 or the down-display pushbutton 38, as necessary. The water heater usage rate data is measured the same as is the furnace usage rate data.

The air conditioner usage rate data is entered into to air conditioner usage rate register of the RAM 24 by depressing the mode advance pushbutton 32 until the "air conditioner usage rate" indicator lamp 57 is illuminated, then simultaneously depressing the enable display pushbutton 34 in conjunction with either the up display pushbutton 36 or the down display pushbutton 38. The air conditioner usage rate data is in the dimension of kilowatts and is obtained from the nameplate of the air conditioner 16.

Figure 8:
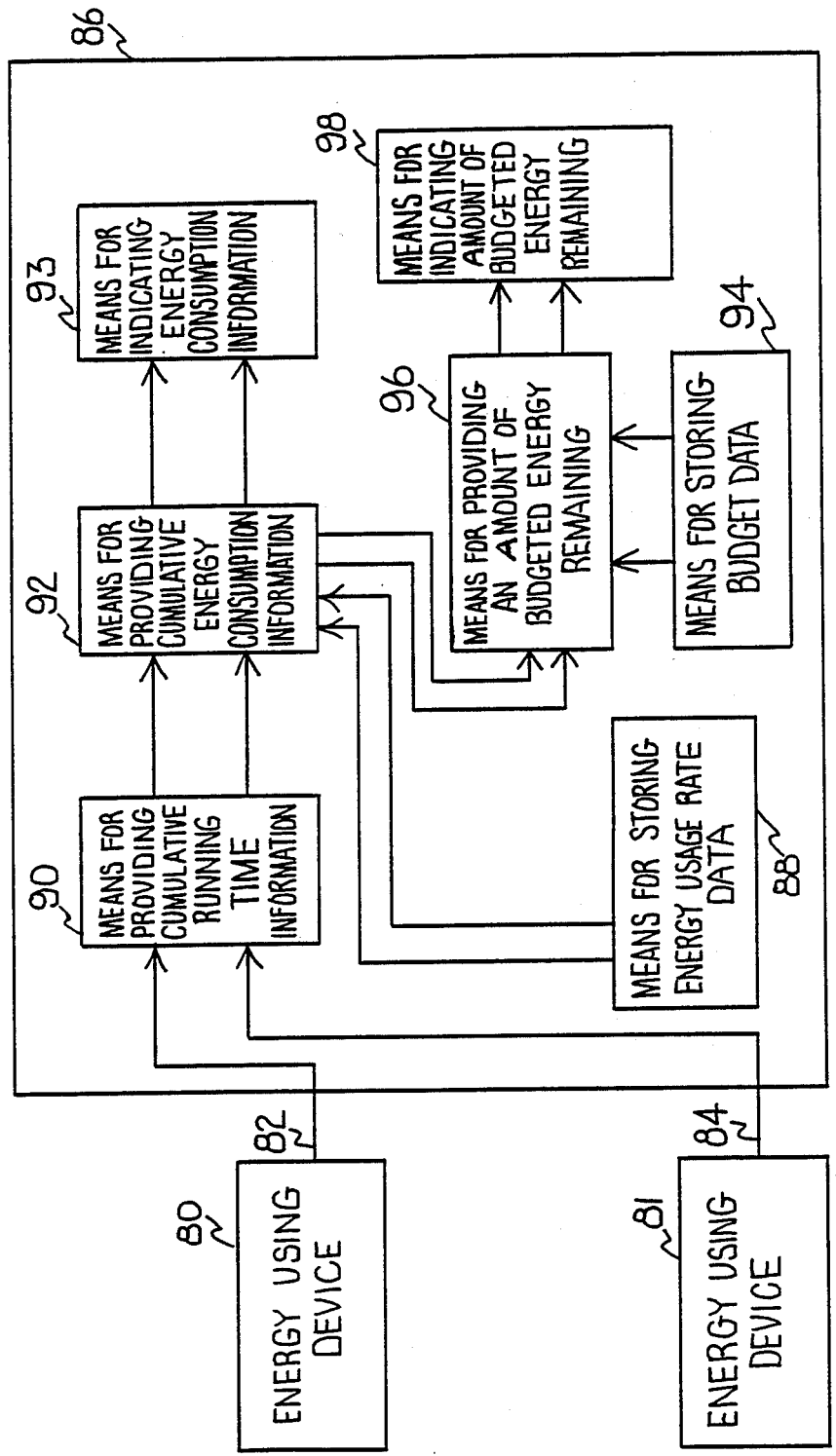

Turning now to FIG. 8, which is a block diagram of the invention, there are shown two energy-suing devices 80,81 having respective first and second energy usage rates. As previously discussed, the energy-using devices 80,81 may be an air conditioner, water heater, furnace, or any other energy-using device.

The energy-using devices 80,81 both provide signals 82,84 respectively, when operating. As previously discussed, the signal, for example, could be produced by a control, such as a thermostat, for turning on and off its respective device.

FIG. 8 further includes a processor 86. The processor 86 has means 88 for separately storing energy usage rate data. The data represents individual rates of energy consumption for both of the devices 80,81. This storing means may be the RAM memory 24, as discussed earlier.

The processor 86 further includes means 90 responsive to said signals 82,84 for separately providing cumulative running time information for both of the devices.

Processor 86 further includes means 92, which are associated with the providing means 90 and the storing means 88 for separately producing cumulative energy consumption information for each of the devices. There are also means 93 associated with the producing means 92 for separately indicating the energy consumption information for each of the devices 80,81. A discussed earlier, this indicating means may be an LED display.

The processor 86 further includes means 94 for storing budget data which is an allotted amount of energy to be used by each device 80,81. This means 94 may also be the RAM 24. The block 96, associated with the block 92 and the block 94 is means 96 for providing an amount of budgeted energy left to be used by each of the devices 80,81. Lastly, the processor 86 includes means 78 for separately indicating the remaining budgeted energy for both of the devices, which may be LED display.

A flow chart illustrating operation of the energy monitor 10 is illustrated in FIGS. 2–7.

Figure 2:
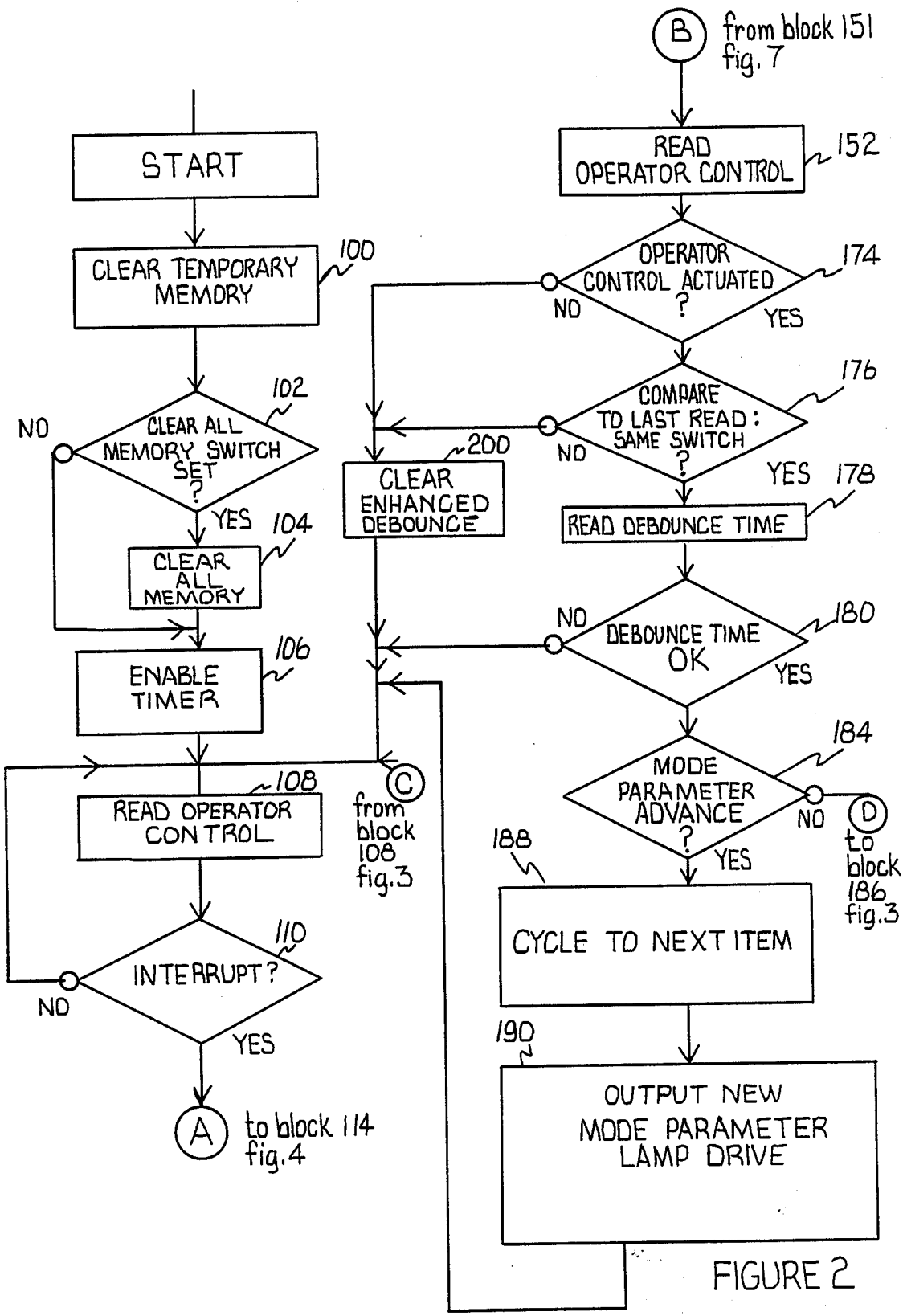
FIGS. 2-7 combine to form a flow chart illustrating operation of the invention and FIG. 8 is a block diagram of the invention.

Referring to FIG. 2, upon power-up of the monitor 10, a block 100 clears the RAM scratchpad registers 24b and control passes to a block 102.

The block 102 determines whether the clear all memory switch 27 has been set. If the clear all memory switch 27 has been set, control passes to a block 104 which clears the RAM nonvolatile registers 24a and control passes to a block 106. If the block 102 determines that the clear all memory switch 27 has not been set, control passes directly to the block 106.

The clearing of the RAM nonvolatile registers 24a erases all data previously entered in the mode display option registers. The clearing of the RAM scratchpad registers 24b simply resets the interval timers to their starting conditions, but does not effect the data stored in the mode display option registers.

The block 106 initiates the timer 26, which generates an interrupt pulse every two milliseconds. Control then passes to a block 108.

The block 108 reads the operator switches 29 to determine which, if any, are actuated, and control passes to a block 110. The block 110 waits for the next one of the interrupt pulses generated by the timer 27. Thus, the block 108 continues to read the operator switches 29 until the block 110 receives the following interrupt pulse, at which time control passes to a block 114, FIG. 4. By continuing to read the operator switches 29 until the following interrupt pulse is received, misread data as a result of noise is significantly reduced.

Figure 4:
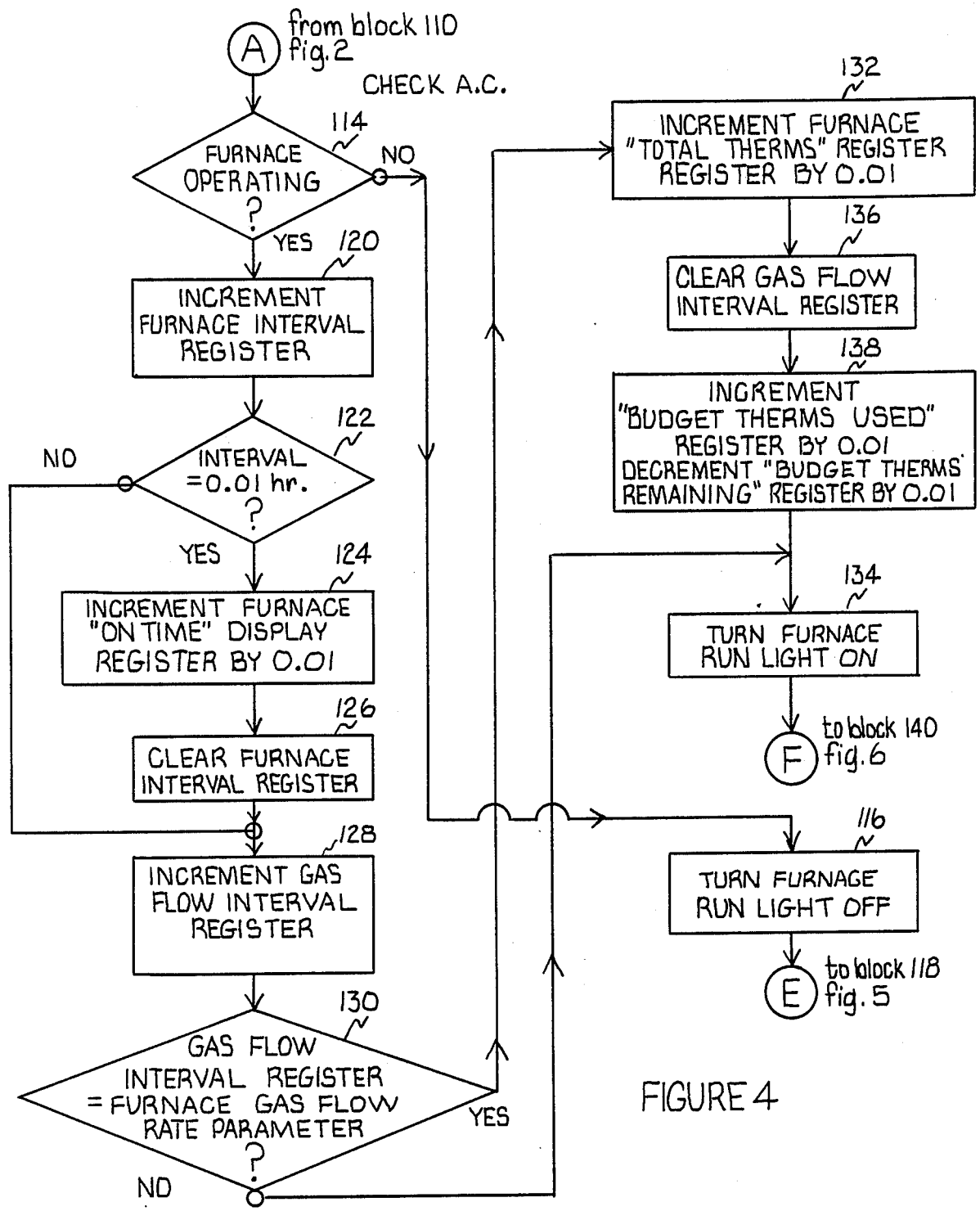

Referring to FIG. 4, the block 114 determines if the furnace 12 is currently operating. If the block 114 determines that the furnace 12 is not operating, control passes to a block 116, which turns off the "furnace running" indicator light 64, and control passes to a block 118, FIG. 5. However, if the block 114 determines that the furnace 12 is currently operating, control passes to a block 120 which increments the "furnace run time" interval register of the scratchpad RAM 24b. The "furnace run time" interval register counts the interrupt pulses while the furnace 12 is operating, each count representing two milliseconds. After incrementing the "furnace run time" interval register, control passes to a block 122 which determines whether the count in the "furnace run time" interval register equals 18,000. Once the block 122 determines that the "furnace run time" interval register has counted 18,000 pulses, indicating that the "furnace run time" register can be incremented by 0.01 hours, control passes to a block 124 which increments the "furnace run time" register by 0.01, and control passes to a block 126 which resets the "furnace run time" interval to zero. 18,000 pulses, at two milliseconds per pulse, represents 0.01 hours, or 36 seconds. The "furnace run time" interval register counts pulses until it has counted 18,000 pulses, at which time the least significant digit of the "furnace run time" register can be incremented. Thus is the "furnace run time" interval register simply acts as a high resolution counter for the "furnace run time" register. Control then passes to a block 128. If the block 122 determines that the "furnace run time" interval does not yet equal 18,000, control also passes to the block 128.

The block 128 increments the "gas flow" interval register, and control passes to a block 130. The "gas flow" interval register is a high resolution counter for the "gas flow" register.

As indicated above, the energy monitor contains energy usage rate data representing the amount of time required for the furnace 12 to consume one cubic foot of gas. The "gas flow" interval register stores counts pulses representing the amount of time that the furnace 12 has been operating, and when the total time that the furnace 12 has been operating equals the amount of time required for the furnace 12 to consume 1 cubic foot of gas or (0.01 therms), the energy monitor 10 knows that 1 cubic foot of gas has been consumed. If the block 130 determines that 1 cubic foot of gas has been consumed, control passes to a block 132 which increments the "furnace therms used" register by 0.01. If the block 130 determines that 1 cubic foot of gas has not yet been consumed, control passes to a block 134.

Returning to the block 132, after the "furnace therms used" register has been incremented by 0.01, control passes to the block 136 which clears the "gas flow" interval register, and control passes to a block 138. The block 138 increments the "budget therms used" register by 0.01 and decrements the "budget therms remaining" register also by 0.01. Control then passes to the block 134.

Figure 6:
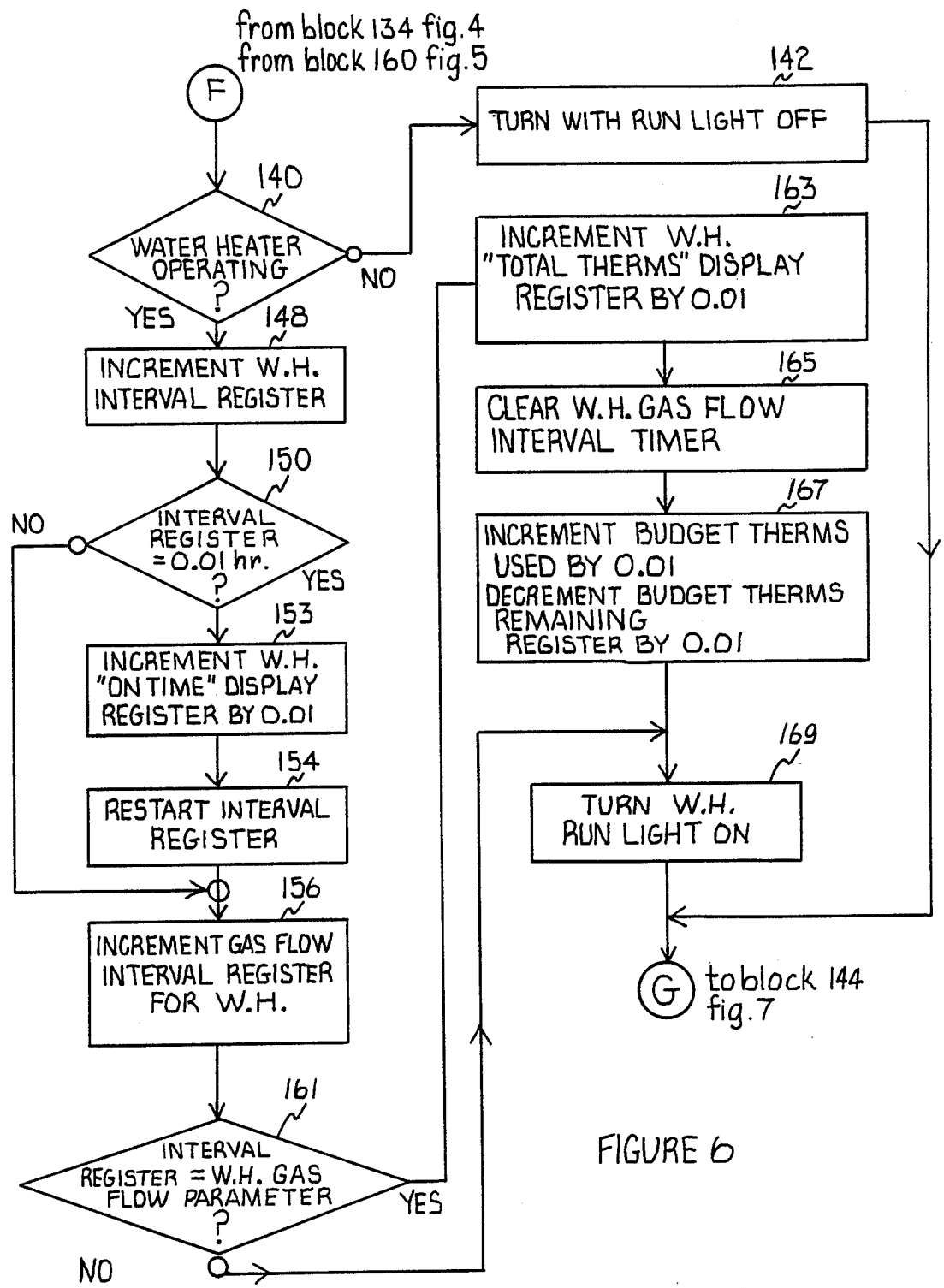

The block 134 turns on the "furnace running" indicator light 64, and control passes to a block 140, FIG. 6, which determines whether the water heater 14 is currently operating. Because at this point it has been already determined that the furnace 12 is operating, the energy monitor 10 assumes that the air conditioner 16 is therefore not also operating.

Figure 7:
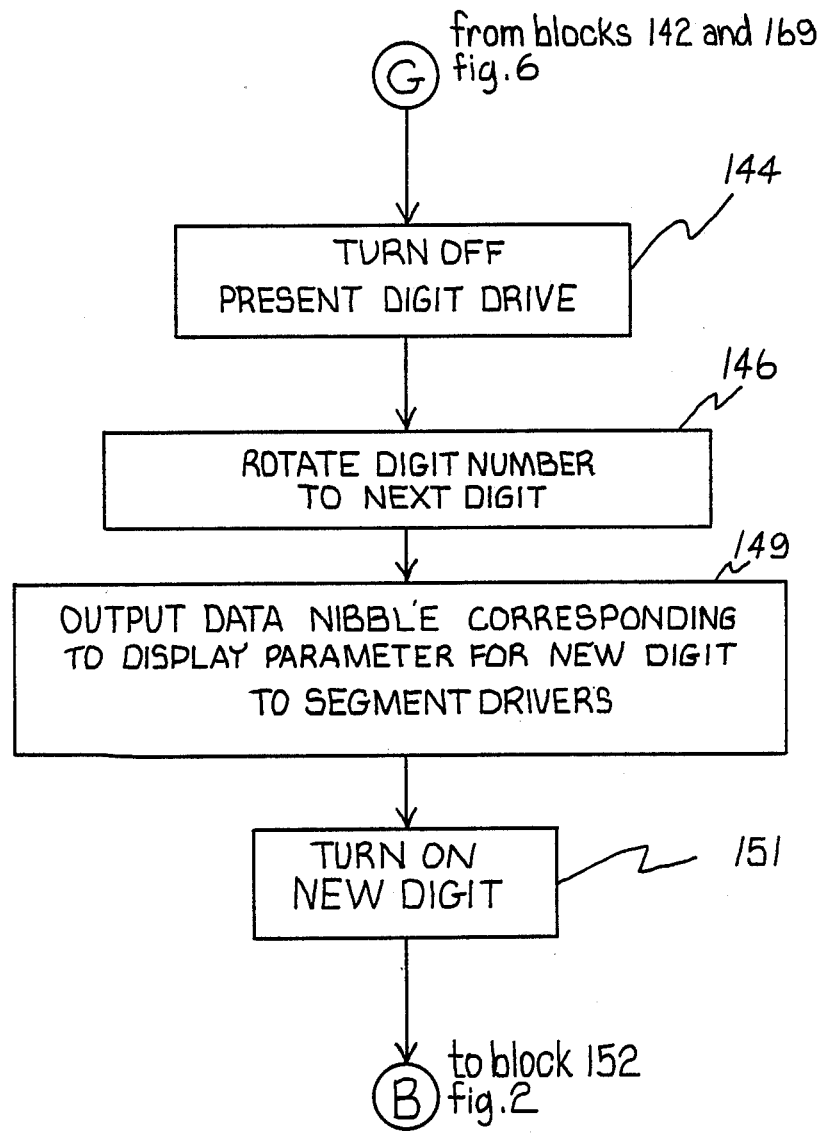

Referring to FIG. 6, if the block 140 determines that the water heater 14 is not currently operating, control passes to a block 142 which turns off the "water heater running" indicator light 66, and control passes to a block 144 of FIG. 7. However, if the block 140 determines that the water heater 16 is currently operating, control passes to a block 148 which increments the "water heater run time" interval register, and control passes to a block 150. For the same reasons as with respect to the "furnace run time" interval register, above, the block 150 determines whether the "water heater run time" interval register equals 18,000, again representing 0.01 hours in time. If so, control passes to a block 153 which increments the "water heater run time" register by 0.01, and a block 154 then clears the "water heater" interval register. Control then passes to a block 156.

If the block 150 determines that the "water heater run time" interval register does not yet equal 18,000, control passes directly to the block 156.

The block 156 increments the "water heater gas flow" interval register, and a block 161 determines whether the data stored in the "water heater gas flow" interval register equals 0.01 of the water heater energy usage rate, indicating that 1 cubic foot of gas has been consumed by the water heater 16. If so, control passes to a block 163 which increments the "water heater therms used" register by 0.01 therm, and a block 165 clears the "water heater gas flow" interval register. Control then passes to a block 167 which increments the "total therms used" register by 0.01 and decrements the "total therms remaining" register by 0.01, and control passes to a block 169. If the block 161 determines that the "water heater gas flow" interval register does not equal 0.01 of the water heater energy usage rate, control passes directly to the block 169. The block 169 turns on the "water heater running" indicator light 66, and control passes to the block 144 of FIG. 7.

Referring to FIG. 7, blocks 144, 146, 149 and 151 operate to cause the LED display 31 to display the current value of the selected one of the mode display options. The LED display 31 comprises six seven-segment LED digits, of which only one digit is illuminated at a time. The converter 72 multiplexes data to the LED display 31, cyclically illuminating each of the six digits at an extremely rapid rate. Because of the rapid rate at which the six digits are cyclically illuminated, it appears that all six digits are constantly illuminated.

The block 144 turns off the LED digit currently illuminated, the block 146 then cycles the converter 72 to the next digit and control passes to the block 149. The illuminated one of the first mode display 30a indicator lights indicates which mode display option is to be displayed by the LED display 31. The block 149 determines which one of the mode display options is currently selected to be displayed and outputs from its respective register the data representing the selected digit of the selected mode display option to be displayed. The block 151 then illuminates the selected digit.

After the block 151 turns on the selected digit, control passes to a block 152, FIG. 2.

Figure 5:
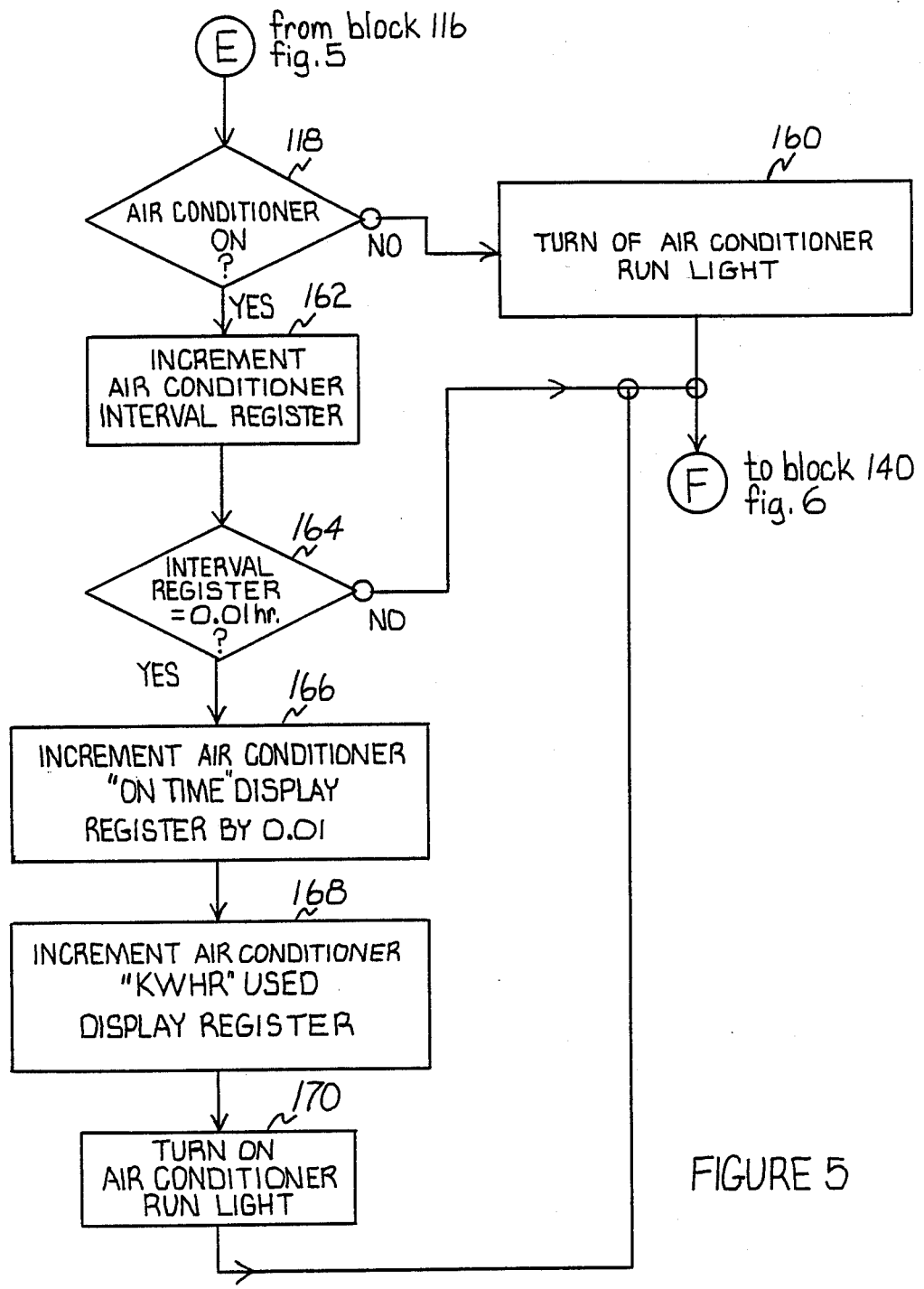

Returning to FIG. 4, if the block 114 determines that the furnace 12 is not currently operating, control passes to the block 116 which turns off the "furnace running" indicator light 64, and control passes to the block 118, FIG. 5.

Referring to FIG. 5, the block 118 determines whether the air conditioner 16 is currently on. If the block 118 determines that the air conditioner 16 is not on, control passes to a block 160 which turns off the "air conditioner running" indicator light 68, and control passes to the block 140, FIG. 6.

However, if the block 118 determines that the air conditioner 16 is operating, control passes to a block 162 which increments the "air conditioner run time" interval register, and a block 164 determines whether the "air conditioner run time" interval register equals 18,000 pulses. If the block 164 determines that the "air conditioner run time" interval register does not equal 18,000 pulses, control passes to the block 140, FIG. 6.

If the block 164 determines that the "air conditioner run time" interval register does equal 18,000 pulses, control passes to a block 166 which increments the "air conditioner run time" register by 0.01 hours, and a block 168 increments the "air conditioner kilowatt hours used" register. Control then passes to a block 170 which turns on the "air conditioner running" indicator light, and control passes to the block 140, of FIG. 6.

Referring to FIG. 2, the block 152 reads the operator switches 29, and a block 174 determines if one of the operator switches 29 is actuated. If the block 174 determines that one of the operator switches 29 is actuated, a block 176 determines whether this is the same particular one of the operator switches 29 which had been actuated and previously read by the block 108. This operation is to prevent faulty data entry due to noise. If the block 176 determines that it was the same one of the operator switches 29 previously actuated, a block 178 reads the current value in a debounce register located in the RAM 24.

To prevent misentry of data due to an unintentional actuation of any of the operator switches 29, and to increment the LED display 31 at a rate slower than every two milliseconds when entering data, the debounce register controls how many interrupt pulses must be received after detection of actuation of one of the operator switches 29 before proceeding. The block 180 compares the current count in the debounce register indicating how long the particular one of the operator switches 29 has been actuated to a debounce parameter. If the block 180 determines that the count in the debounce register does not equal the debounce parameter, control returns to the block 108. Otherwise control passes to a block 184 which determines whether the particular one of the operator switches 29 actuated was the mode parameter advance button 32. If not, control passes to a block 186 of FIG. 3. However, if the block 184 determines that the particular one of the operated switches 29 actuated was the mode parameter advance button 32, control passes to a block 189 which cycles the mode display 30 to the next mode display option, and control passes to a block 191. The block 191 causes illumination of the next one of the mode display option indicator lights, and control passes to the block 108.

Figure 3:
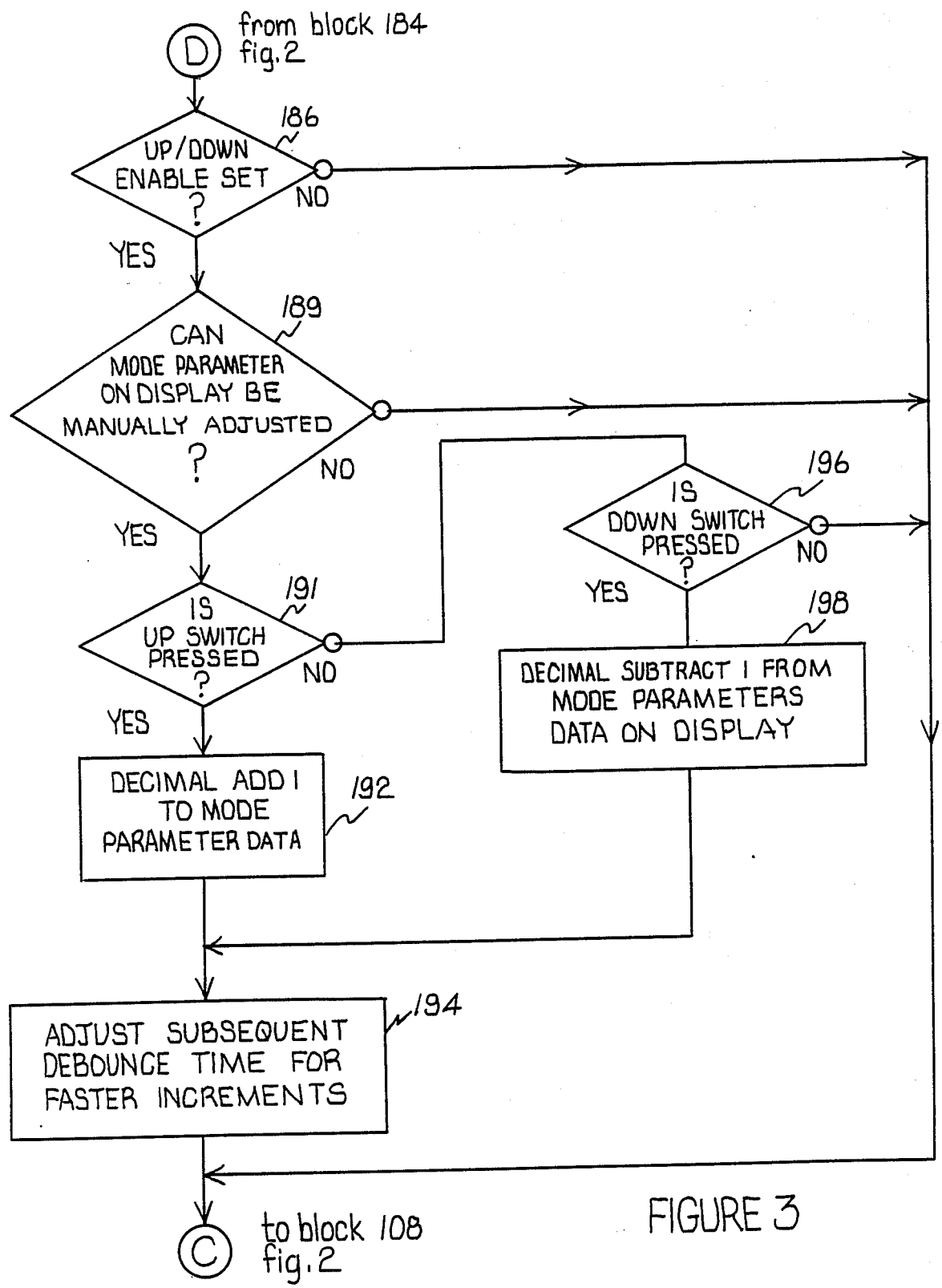

If the block 184 determines that the mode advance pushbutton 32 is not actuated, control passes to the block 186, FIG. 3.

Referring to FIG. 3, the block 186 determines whether the enable display pushbutton 34 is actuated. If not, control passes to the block 108 of FIG. 2, as data cannot be entered unless the enable display pushbutton is actuated. However, if the block 186 determines that the enable display pushbutton 34 has been actuated, control passes to a block 188 which determines whether the display option currently selected is user programmable data, i.e., data which is manually entered or adjusted by the user. If the block 189 determines that it is not user programmable data, control passes to the block 108, FIG. 2. However, if the block 189 determines that it is user programmable data, control passes to a block 191. The block 191 determines whether the up display pushbutton 36 is actuated. If so, control passes to a block 192 which increments the value in the register of its respective mode display option, and control passes to a block 194 which decrements the debounce parameter, and control passes to the block 108.

As indicated above, the debounce parameter determines how long a pushbutton must be actuated before initiating a response. The debounce parameter default setting is thirty interrupt pulses. However, the block 194 progressively reduces the debounce parameter from the default setting of thirty pulses while the enable pushbutton 32 is actuated in conjunction with actuation of either the up display pushbutton 36 or the down display pushbutton 38 in order to accelerate data entry.

If the block 191 determines that the up display pushbutton 36 is not actuated, control passes to a block 196 which determines whether the down display pushbutton 38 is actuated. If not, control passes to the block 108 of FIG. 2. However, if the block 196 determines that the down display pushbutton 38 is actuated, a block 198 decrements the displayed mode parameter data, and control passes to the block 194.

Referring again to FIG. 2, if either the block 174 determines that one of the operator switches 29 has not been actuated, or the block 176 determines that the one of the operator switches 29 currently actuated is not the same one as was read by the block 108, control passes to a block 200 which resets the debounce parameter to its default setting.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

What is claimed:

1. An energy monitor for individually monitoring first and second energy consuming devices which produce signals when operating, said devices having respective first and second rates of energy usage, said energy monitor comprising:
   a processor;
   means associated with said processor for storing energy usage rate data, said data representing individual rates of energy consumption for each of said devices;
   means associated with said processor and responsive to said signals for separately providing cumulative running time information for each of said devices;
   means associated with said providing means and said storing means for separately producing cumulative energy consumption information for each of said devices; and
   means associated with said producing means for separately indicating said energy consumption information for each of said devices.

2. The energy monitor of claim 1 wherein said energy consumed by at least one of said devices comprises gas, and said energy consumption information for said device represents therms of gas consumed.

3. The energy monitor of claim 1 wherein said energy consumed by at least one of said devices comprises electricity, and said energy consumption information for said device represents kilowatt-hours of electricity consumed.

4. The energy monitor of claim 1 wherein said cumulative running time information for each of said devices is in the form of operating time numbers representing separate total times that each of said devices is operated, and further including means for separately displaying said operating time numbers for each of said devices.

5. The energy monitor of claim 1 further including:
   means associated with said processor for storing budget data, said budget data representing individual budgeted quantities of energy to be consumed by each of said devices;
   means associated with said means for storing budget data and said producing means for providing remaining budgeted energy information, said remaining budgeted energy information representing individual remaining quantities of energy allowed to be consumed by each of said devices; and
   means for separately displaying said remaining budgeted energy information for each of said devices.

6. The energy monitor of claim 5 further including means for selectively alternately displaying said energy consumption information and said remaining budgeted energy information for each of said devices.

7. An energy monitor for individually monitoring first and second energy consuming devices which produce individual operating signals, said devices having respective first and second rates of energy usage, said energy monitor comprising:
   input means for providing separate interface signals in response to said operating signals;
   computer means responsive to said interface signals for accumulating individual running time information for each of said devices, for storing energy usage rate data, said date representing individual rates of energy consumption for each of said devices, and responsive to said stored energy usage rate data and said accumulating running time information for generating separate cumulative energy consumption information for each of said devices; and
   output means for separately providing an indication of said energy consumption information for each of said devices.

8. The energy monitor of claim 7 wherein the accumulated individual running time information for each of said devices is in the form of operating time numbers representing separate total times that each of said devices is operated, and said energy monitor further including means for separately displaying said operating time numbers for each of said devices.

9. The energy monitor of claim 7 wherein the computer means is also for storing budget data, said budget data representing individual budgeted quantities of energy to be consumed by each of said devices, and is responsive to said stored budget data and said cumulative energy consumption information for providing remaining budgeted energy information, said remaining budgeted energy information representing individual remaining quantities of energy allowed to be consumed by each of said devices; and
   said energy monitor further including output means for separately displaying said remaining budgeted energy information for each of said devices.

10. A method for individually monitoring first and second energy consuming devices which produce operating signals, said devices having respective first and second rates of energy uses, said method comprising:
   providing interface signals in response to said operating signals;
   accumulating separate running time information from said interface signals for each of said devices;
   storing energy usage rate data, said data representing individual rates of energy consumption for each of said devices generating separate cumulative energy consumption information for each of said devices; and
   providing an indication of said energy consumption information for each of said devices.

11. The method as recited in claim 10 wherein the step of accumulating separate running time information includes providing the accumulated running time information in the form of operating time numbers representing separate total times that each of said devices is operated, and said method further including the step of separately displaying said operating time numbers for each of said devices.

12. The method as recited in claim 10 further including the steps of:
storing budget data, said budget data representing individual budgeted quantities of energy to be consumed by each of said devices;
providing remaining budgeted energy information, said remaining budgeted energy information representing individual remaining quantities of energy allowed to be consumed by each of said devices; and
separately displaying said remaining budgeted energy information for each of said devices.

* * * * *